United States Patent [19]
Havel

[11] Patent Number: 6,121,767
[45] Date of Patent: *Sep. 19, 2000

[54] DIGITAL MULTIMETER WITH VARIABLE COLOR RANGE INDICATION

[76] Inventor: Karel Havel, 15 Kensington Road #704, Bramalea, Ontario, Canada, L6T 3W2

[ * ] Notice: This patent is subject to a terminal disclaimer.

[21] Appl. No.: 09/275,711

[22] Filed: Mar. 24, 1999

Related U.S. Application Data

[62] Division of application No. 08/910,080, Aug. 12, 1997, Pat. No. 6,018,237, which is a division of application No. 08/571,246, Dec. 12, 1995, Pat. No. 5,656,935, which is a division of application No. 08/187,350, Jan. 27, 1994, Pat. No. 5,475,300, which is a division of application No. 07/865,460, Apr. 9, 1992, Pat. No. 5,283,517, which is a division of application No. 07/628,328, Dec. 14, 1990, Pat. No. 5,122,733, which is a division of application No. 07/197,322, May 23, 1988, abandoned, which is a division of application No. 06/819,111, Jan. 15, 1986, Pat. No. 4,794,383.

[51] Int. Cl.[7] .............................. G01R 15/08; G09G 5/02
[52] U.S. Cl. .............................. 324/115; 345/83; 345/150
[58] Field of Search ................... 324/115, 99 D, 324/713, 715; 345/83, 150

[56] References Cited

U.S. PATENT DOCUMENTS

| | | |
|---|---|---|
| 2,643,344 | 6/1953 | McLaren et al. . |
| 2,648,015 | 8/1953 | Greenfield et al. . |
| 2,682,000 | 6/1954 | Clayton et al. . |
| 2,889,518 | 6/1959 | Hudson et al. . |
| 3,595,991 | 7/1971 | Diller . |
| 3,740,570 | 6/1973 | Kaelin et al. . |
| 3,760,174 | 9/1973 | Boening et al. . |
| 3,840,873 | 10/1974 | Usui . |
| 3,911,418 | 10/1975 | Takeda . |
| 3,924,227 | 12/1975 | Stolov . |
| 4,086,514 | 4/1978 | Havel . |
| 4,271,408 | 6/1981 | Teshima et al. . |
| 4,301,450 | 11/1981 | Smoliar . |
| 4,488,149 | 12/1984 | Givens, Jr. . |
| 4,559,480 | 12/1985 | Nobs . |
| 4,581,612 | 4/1986 | Jones . |
| 4,647,217 | 3/1987 | Havel ........................................ 368/10 |
| 4,689,613 | 8/1987 | Ikeda . |
| 4,720,709 | 1/1988 | Imamura et al. . |
| 4,740,818 | 4/1988 | Tsilibes et al. . |
| 4,771,274 | 9/1988 | Havel ...................................... 345/150 |
| 4,794,383 | 12/1988 | Havel ...................................... 345/150 |

FOREIGN PATENT DOCUMENTS

| | | |
|---|---|---|
| 220844 | 4/1985 | German Dem. Rep. . |
| 3037-500 | 4/1981 | Germany . |
| 3009416 | 9/1981 | Germany . |
| 57-146112 | 9/1982 | Japan . |
| 2158631 | 11/1985 | United Kingdom . |

OTHER PUBLICATIONS

Wagner, B., "2–color LED + Drover = Versatile Visual Effects", EDN vol. 25, No. 19, Oct. 20, 1980.

Smithline, L.M., "Dual light emitting diode synthesizes polychromatic light", Electronics, Aug. 16, 1979, p. 130.

Svestka, M. et al, "LED's change color to indicate balance voltage", Electronic Engineering, vol. 48, No. 576, p. 19, Feb. 1976.

Saitoh, T. et al. "Multicolor light–emitting diodes with double junction structure". IEEE Transactions on Electron Devices, Feb. 1975, vol. ED–22, No. 2, pp. 29–32.

(List continued on next page.)

*Primary Examiner*—Ernest Karlsen
*Attorney, Agent, or Firm*—James J. Murphy, Esq.; Winstead Sechrest & Minick

[57] ABSTRACT

A measuring device automatically illuminates a digital indication of the measured value in a color in accordance with the selected measurement range.

8 Claims, 8 Drawing Sheets

OTHER PUBLICATIONS

Yamaguchi, T. et al, "A High Brightness Gap Multicolor LED", IEEE Transactions on Electron Devices, vol. ED–28, No. 5, May 1981, pp. 588–592.

Baker, M., "Chip changes the color of light–emitting diodes", Electronics, Apr. 7, 1981, pp. 158–159.

Rao, V., Two LEDs blend and blink to indicate six states. Electronic Design, vol. 30, No. 16, p. 220, Aug. 5, 1982.

Kojima, T. "Recent flat panel development in Japan", held in San Diego, CA, Apr. 29–May 1, 1980. SID 80 Digest, pp. 22–23.

Niina, T. et al, "A multi–color GaP LED flat panel display device" New York, NY, USA, Apr. 28–30, 1981. 1981 SID International Symposium Digest of Papers, vol. XII (1981), pp. 140–141.

Niina, T. et al, "A multi–color LED flat panel display device for colorful displays of letters and figures". Proceedings of the SID, vol. 23, No. 2, pp. 73–76, 1982 (month unavailable).

O'Mara, P.A. et al, "Microprocessor–controlled light–emitting diode dark adaptometer". Medical & Biological Engineering and Computing, vol. 20, No. 1, pp. 70–76, 1982 (month unavailable).

Landauer, R. W., "Electroluminescent Display", IBM Technical Disclosure Bulletin, vol. 8, No. 11, pp. 15–16, Apr. 11, 1966.

DIGITAL MULTIMETER WITH VARIABLE COLOR RANGE INDICATION

CROSS-REFERENCE TO RELATED APPLICATIONS

This is a division of my application Ser. No. 08/910,080, filed on Aug. 12, 1997, entitled Variable Color Display System, now U.S. Pat. No. 6,018,237, which is a division of my application Ser. No. 08/571,246, filed on Dec. 12, 1995, entitled Variable Color Display System, now U.S. Pat. No. 5,656,935 issued on Aug. 12, 1997, which is a division of my application Ser. No. 08/187,350, filed on Jan. 27, 1994, entitled Variable Color Digital Multimeter, now U.S. Pat. No. 5,475,300 issued on Dec. 12, 1995, which is a division of my application Ser. No. 07/865,460, filed on Apr. 9, 1992, entitled Variable Color Digital Multimeter, now U.S. Pat. No. 5,283,517 issued on Feb. 1, 1994, which is a division of my application Ser. No. 07/628,328, filed on Dec. 14, 1990, entitled Variable Color Digital Multimeter, now U.S. Pat. No. 5,122,733 issued on Jun. 16, 1992, which is a division of my application Ser. No. 07/197,322, filed on May 23, 1988, entitled Variable Color Digital Multimeter, now abandoned, which is a division of my application Ser. No. 06/819,111, filed on Jan. 15, 1986, entitled Variable Color Digital Multimeter, now U.S. Pat. No. 4,794,383 issued on Dec. 27, 1988.

Reference is also made to my related applications Ser. No. 06/817,114, filed on Jan. 8, 1986, entitled Variable Color Digital Timepiece, now U.S. Pat. No. 4,647,217 issued on Mar. 3, 1987, Ser. No. 06/839,526, filed on Mar. 14, 1986, entitled Variable Color Display Telephone, now U.S. Pat. No. 4,726,059 issued on Feb. 16, 1988, Ser. No. 06/940,100, filed on Dec. 10, 1986, entitled Digital Voltmeter with Variable Color Background, now U.S. Pat. No. 4,831,326 issued on May 16, 1989, Ser. No. 06/922,847, filed on Oct. 24, 1986, entitled Continuously Variable Color Display Device, now U.S. Pat. No. 4,845,481 issued on Jul. 4, 1989, Ser. No. 07/322,341, filed on Mar. 13, 1989, entitled Continuously Variable Color Optical Device, now U.S. Pat. No. 4,965,561 issued on Oct. 23, 1990, Ser. No. 07/379,616, filed on Jul. 14, 1989, entitled Variable Color Digital Display for Emphasizing Position of Decimal Point, now U.S. Pat. No. 5,003,298 issued on Mar. 26, 1991, Ser. No. 06/920,740, filed on Oct. 20, 1986, entitled Step Variable Color Display Device, now abandoned, Ser. No. 06/931,626, filed on Nov. 17, 1986, entitled Variable Color Hybrid Display Device, now abandoned, and Ser. No. 07/157,603, filed on Feb. 19, 1988, entitled Variable Color Multiplexed Display System, now abandoned, which describe the devices employing a variable color display.

BACKGROUND OF THE INVENTION

1. Field of the Invention

This invention relates to digital multimeters utilizing a variable color display.

2. Description of the Prior Art

An electronic display having segments wherein each segment is capable of selectively illuminating two colors is disclosed in U.S. Pat. No. 4,488,149 issued on December 11, 1984 to William A. Givens, Jr. Two AND gates are provided for biasing, in each display segment, either a first light emitting diode, for emitting a first color, or a second light emitting diode, for emitting a second color. It is not contemplated to illuminate both light emitting diodes in each segment simultaneously for blending the colors.

Commercially available measuring instruments with monochromatic digital readout are capable of performing measurements and displaying results at a relatively fast rate. However, to determine a significance of each measured value, an operator must rapidly read displayed values and perform mental comparisons with predetermined limits. The task is much more complicated when the measurement ranges are variable.

A system for measuring radioactivity is described in U.S. Pat. No. 2,643,344, issued on Jun. 23, 1953 to Ian H. McLaren et al. Another systems for measuring radioactivity are described in U.S. Pat. No. 2,648,015 issued on August 4, 1953 to Alexander Greenfield et al., and in U.S. Patent No. 2,682,000 issued on Jun. 22, 1954 to Joseph F. Clayton et al. Since these three patents are very similar, they are equally authoritative. The system for measuring radioactivity, disclosed in the three patents, includes an analog pointer indicator having three scales, with three associated colored light bulbs, for indicating which scale is applicable for the reading of the measured value. A mechanism for automatic range selection is provided, which is controlled by two solenoids, and which also controls the three associated colored light bulbs. In response to the range selection, one of the light bulbs illuminates the indicator face with a distinctive color to indicate which measurement scale is applicable.

A digital meter is disclosed in U.S. Pat. No. 2,889,518, issued on Jun. 2, 1959 to Harold R. Hudson et al. The digital meter includes a motor, a wheel counter rotatable by the motor, a potentiometer rotatable by the motor, and a mechanical sampler (vibrator). An unknown voltage is compared, by the sampler, with an instant reference voltage that appears on the wiper of the potentiometer. The motor keeps rotating the potentiometer until the unknown voltage is equal to the reference voltage. The rotation of the motor is then automatically stopped, which also stops the wheel counter, whose position numerically indicates the value of the measured voltage. The decimal point monochromatic lamps are placed between the wheels of the counter. One of the decimal point lamps is illuminated, by manually operated range switch, to indicate by its position the selected measurement range.

The prior art does not contemplate that the color of a digital indication of the measured value, exhibited on a multi-digit display device, may be controlled in accordance with the measurement range.

SUMMARY OF THE INVENTION

It is the principal object of this invention to provide an improved digital multimeter.

It is another object of the invention to provide a digital multimeter utilizing a variable color display.

It is still another object of the invention to provide a digital multimeter capable of indicating by different colors the measured values on different measurement ranges.

It is still another object of the invention to provide a digital multimeter for simultaneously indicating a measured value, by digital indication, and the measurement range, by color of the digital indication.

It is still another object of the invention to provide a digital multimeter having a multi-digit variable color display, in which the color of all display digits is controlled uniformly in accordance with the measurement range.

It is still another object of the invention to provide a digital voltmeter capable of indicating the measured values of voltage on different ranges by different colors.

It is still another object of the invention to provide a digital ampermeter capable of indicating the measured values of current on different ranges by different colors.

It is still another object of the invention to provide a digital ohmmeter capable of indicating the measured values of resistance on different ranges by different colors.

Other objects of the invention will be obvious from the appended drawings and their description.

In summary, a variable color digital multimeter of the invention, which may have an appearance of a digital voltmeter, a digital ampermeter, or a digital ohmmeter, includes an input scaling device having a plurality of measurement ranges for selectively scaling the measured signal. The invention resides in the provision of a color selector for controlling the color of the digital indication of the measured value in accordance with the selected measurement range.

BRIEF DESCRIPTION OF THE DRAWINGS

In the drawings in which are shown the preferred embodiments of the invention.

Throughout the drawings, like characters indicate like parts.

DESCRIPTION OF THE PREFERRED EMBODIMENTS

Figures 1, 2:
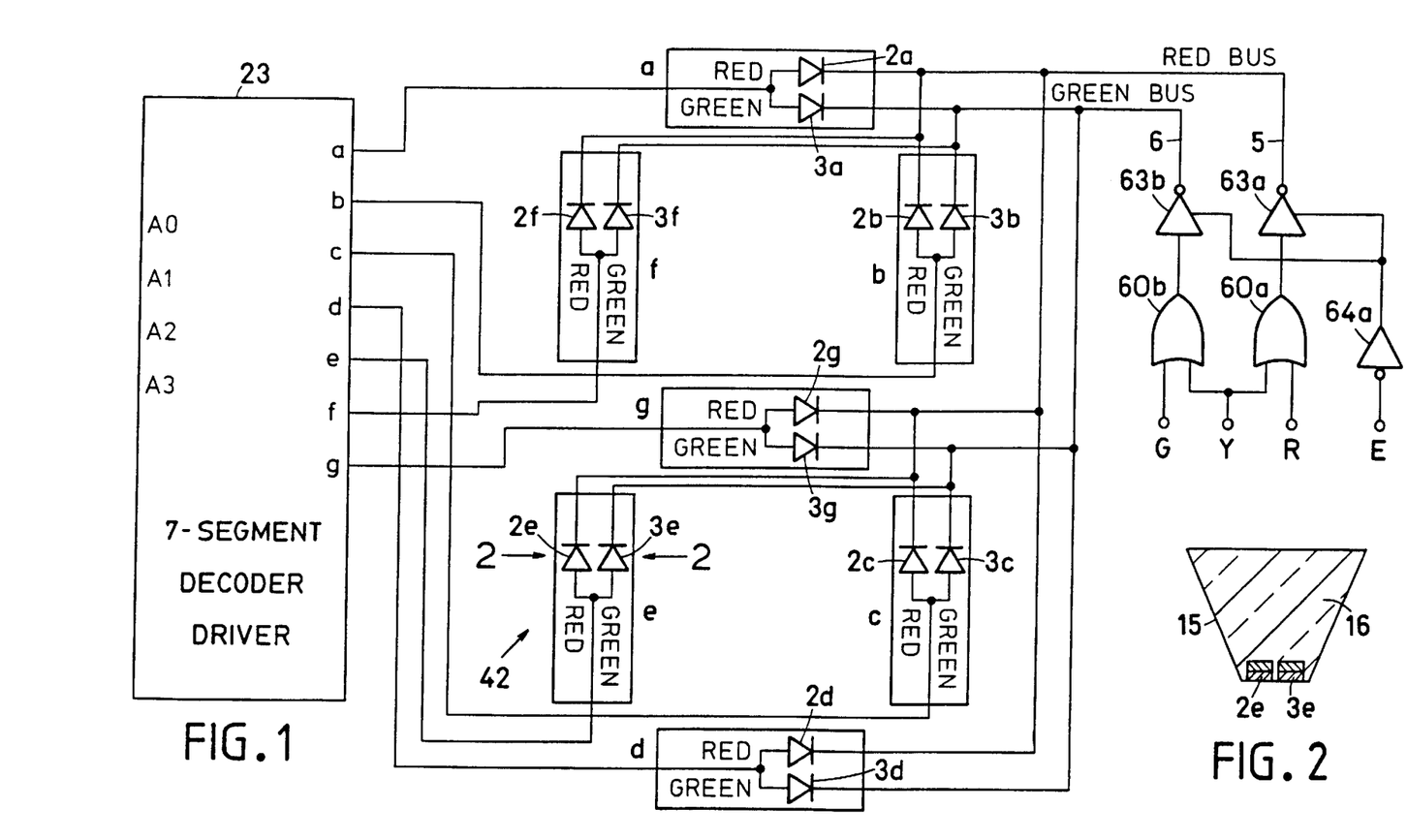
FIG. 1 is a schematic diagram of a single 2-primary color 7-segment display device.
FIG. 2 is an enlarged cross-sectional view of one display segment in FIG. 1, taken along the line 2—2.

Referring now, more particularly, to the drawings, in FIG. 1 is shown a schematic diagram of a 2-primary color common cathodes 7-segment display element 42 which can selectively display various digital fonts in different colors on display segments a, b, c, d, e, f, and g. Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e.g., the red LED in the segment a is designated as 2a, etc.

The anodes of all red and green LED pairs are interconnected in each display segment and are electrically connected to respective outputs of a commercially well known common-cathode 7-segment decoder 23. The cathodes of all red LEDs 2a, 2b, 2c, 2d, 2e, 2f, and 2g are interconnected to a common electric path referred to as a red bus 5. The cathodes of all green LEDs 3a, 3b, 3c, 3d, 3e, 3f, and 3g are interconnected to a like common electric path referred to as a green bus 6.

The red bus 5 is connected to the output of a tri-state inverting buffer 63a, capable of sinking sufficient current to forwardly bias all red LEDs 2a to 2i in display element 42. The green bus 6 is connected to the output of a like buffer 63b. The conditions of red bus 5 and green bus 6 can be controlled by applying valid combinations of logic level control signals to color control inputs R (red), Y (yellow), and G (green), to illuminate display element 42 in a selected color.

The tri-state inverting buffers 63a and 63b can be simultaneously enabled by applying a low logic level signal to the enable input E of an inverter 64a, and disabled by applying a high logic level signal thereto. When both tri-state inverting buffers 63a and 63b are enabled, the conditions of red bus 5, green bus 6, and blue bus 7 can be selectively controlled by applying valid combinations of logic level signals to color control inputs R, Y, and G, for illuminating display element 42 in a selected color. When both tri-state inverting buffers 63a and 63b are disabled, both buses are effectively disconnected, and display element 42 is extinguished. Thus a high logic level at the enable input E extinguishes display element 42. A low logic level at the enable input E illuminates display element 42 in a color determined by the instant conditions of the color control inputs R, Y, and G.

When the enable input E is at a low logic level, the output of inverter 64a rises to a high logic level, thereby simultaneously causing the output of tri-state buffer 63a to be effectively connected to red bus 5, and the output of tri-state buffer 63b to be effectively connected to green bus 6, allowing the currents, which are controlled by the conditions of the color control inputs R, Y, and G, to flow through red bus 5 and green bus 6, for controlling the color of display element 42.

The color control inputs R, Y, G are applied to the inputs of two 2-input OR gates 60a, 60b, whose outputs respectively drive inverting buffers 63a, 63b. Color control R is applied directly to the input of OR gate 60a. In a similar fashion, color control input G is applied directly to the input of OR gate 60b. However, color control input Y is applied simultaneously to the inputs of both OR gates 60a, 60b.

The operation of display element 42 will be now explained by the example of illuminating a digit '7' in three different colors. It is assumed in all these three examples that the enable input E is at a low logic level, for enabling display element 42. Any digit between 0 and 9 can be selectively displayed by applying the appropriate BCD code to the inputs A0, A1, A2, and A3 of common-cathode 7-segment decoder 23. The decoder 23 develops at its outputs a, b, c, d, e, f, and g drive signals for energizing selected groups of the segments to visually display the selected number, in a manner well known to those skilled in the art. To display decimal number '7', a BCD code 0111 is applied to the inputs A0, A1, A2, and A3. The decoder 23 develops high voltage levels at its outputs a, b, and c, to illuminate equally designated segments a, b, and c, and low voltage levels at all remaining outputs (not shown), to extinguish all remaining segments d, e, f, and g.

To illuminate display element 42 in red color, color control input R is raised to a high logic level, and color control inputs Y and G are maintained at a low logic level. As a result, the output of OR gate 60a rises to a high logic level, thereby causing the output of buffer 63a to drop to a low logic level. The current flows from the output a of decoder 23, via red LED 2a and red bus 5, to current sinking output of buffer 63a. Similarly, the current flows from the output b of decoder 23, via red LED 2b and red bus 5, to the output of buffer 63a. The current flows from the output c of decoder 23, via red LED 2c and red bus 5, to the output of buffer 63a. As a result, segments a, b, and c illuminate in red color, thereby causing a visual impression of a character '7'. The green LEDs 3a, 3b, and 3c remain extinguished because the output of buffer 63b is at a high logic level, thereby disabling green bus 6.

To illuminate display element 42 in green color, color control input G is raised to a high logic level, while color control inputs R and Y are maintained at a low logic level. As a result, the output of OR gate 60b rises to a high logic level, thereby causing the output of buffer 63b to drop to a low logic level. The current flows from the output a of decoder 23, via green LED 3a and green bus 6, to current sinking output of buffer 63b. Similarly, the current flows from the output b of decoder 23, via green LED 3b and green bus 6, to the output of buffer 63b. The current flows from the output c of decoder 23, via green LED 3c and green bus 6, to the output of buffer 63b. As a result, segments a, b, and c illuminate in green color. The red LEDs 2a, 2b, and 2c remain extinguished because the output of buffer 63a is at a high logic level, thereby disabling red bus 5.

To illuminate display element 42 in yellow color, color control input Y is raised to a high logic level, while color inputs R and G are maintained at a low logic level. As a result, the outputs of both OR gates 60a and 60b rise to a high logic level, thereby causing the outputs of both buffers 63a and 63b to drop to a low logic level. The current flows from the output a of decoder 23, via red LED 2a and red bus 5, to current sinking output of buffer 63a, and, via green LED 3a and green bus 6, to current sinking output of buffer 63b. Similarly, the current flows from the output b of decoder 23, via red LED 2b and red bus 5, to the output of buffer 63a, and, via green LED 3b and green bus 6, to the output of buffer 63b. The current flows from the output c of decoder 23, via red LED 2c and red bus 5, to the output of buffer 63a, and, via green LED 3c and green bus 6, to the output of buffer 63b. As a result of blending light of red and green colors in each segment, segments a, b, and c illuminate in substantially yellow color.

When the enable input E is raised to a high logic level, the output of inverter 64a drops to a low logic level, thereby causing the output of tri-state buffer 63a to be effectively disconnected from red bus 5, and the output of tri-state buffer 63b to be effectively disconnected from green bus 6, not allowing any currents to flow therethrough. As a result, display element 42 completely extinguishes, regardless of the conditions of the color control inputs R, Y, and G.

In FIG. 2, red LED 2e and green LED 3e are placed on the base of a segment body 15 which is filled with a transparent light scattering material 16. When forwardly biased, LEDs 2e and 3e emit light signals of red and green colors, respectively, which are scattered within transparent material 16, thereby blending the red and green light signals into a composite light signal that emerges at the upper surface of segment body 15. The color of the composite light signal may be controlled by varying the portions of the red and green light signals.

Figures 3, 4:
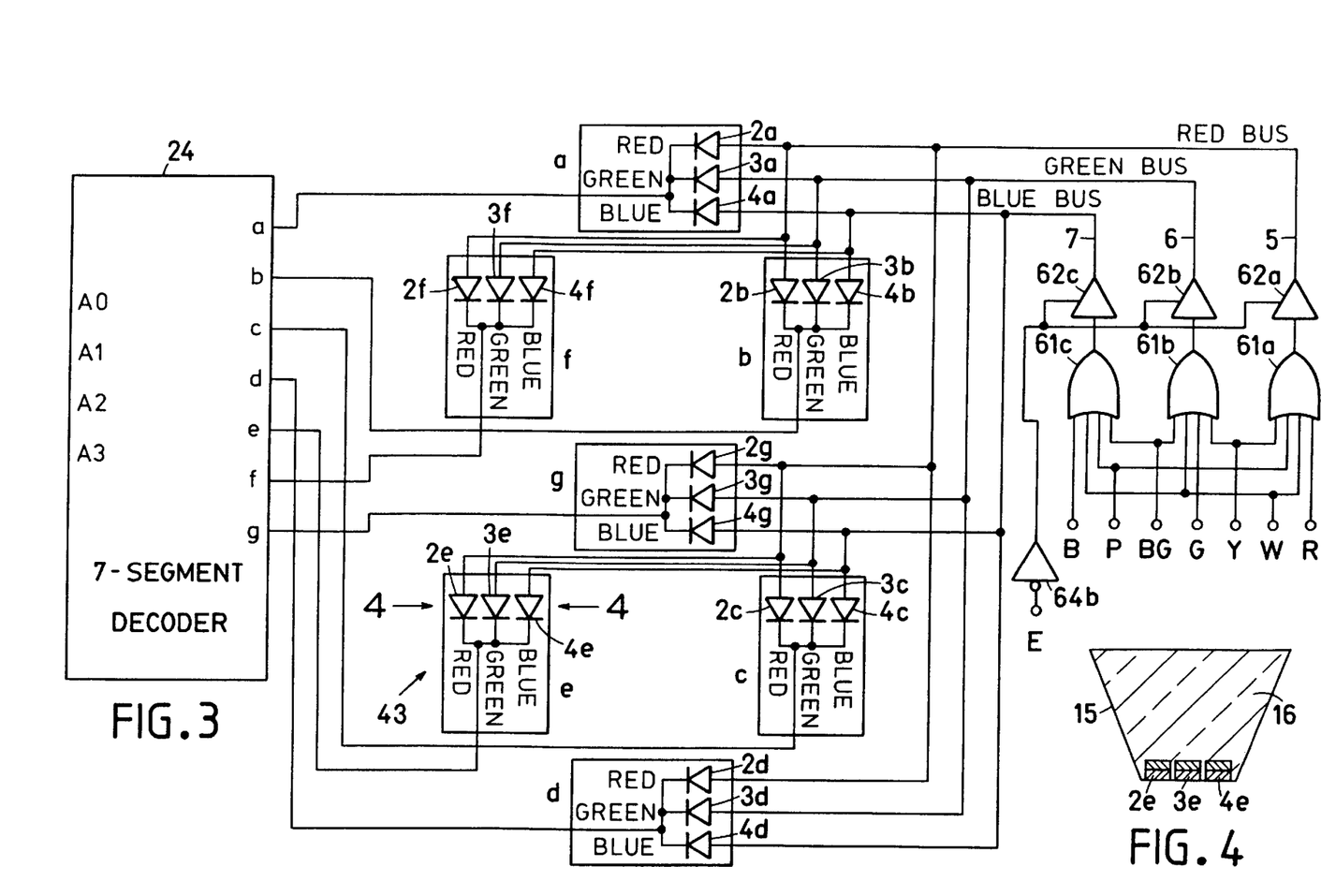
FIG. 3 is a schematic diagram of a single 3-primary color 7-segment display device.
FIG. 4 is an enlarged cross-sectional view of one display segment in FIG. 3, taken along the line 4—4.

In FIG. 3 is shown a schematic diagram of a one-character 3-primary color common anodes 7-segment display element 43 which can selectively display digital fonts in different colors. Each display segment a, b, c, d, e, f, and g includes a triad of LEDs: red LED 2, green LED 3, and blue LED 4, which are closely adjacent such that the light signals emitted therefrom are substantially superimposed upon one another to mix the colors.

The cathodes of all red, green, and blue LED triads in each display segment a, b, c, d, e, f, and g are interconnected and electrically connected to respective outputs of a commercially well known common anode 7-segment decoder 24. The anodes of all red LEDs 2a, 2b, 2c, 2d, 2e, 2f, and 2g are interconnected to form a common electric path referred to as red bus 5. The anodes of all green LEDs 3a, 3b, 3c, 3d, 3e, 3f, and 3g are interconnected to form a like common electric path referred to as green bus 6. The anodes of all blue LEDs 4a, 4b, 4c, 4d, 4e, 4f, and 4g are interconnected to form a like common electric path referred to as blue bus 7.

The red bus 5 is connected to the output of a tri-state non-inverting buffer 62a, capable of sourcing sufficient current to illuminate all red LEDs in display element 43. The green bus 6 is connected to the output of a like tri-state non-inverting buffer 62b. The blue bus 7 is connected to the output of a like tri-state non-inverting buffer 62c. The conditions of red bus 5, green bus 6, and blue bus 7 can be selectively controlled by applying valid combinations of logic level signals to color control inputs B (Blue), P (Purple), BG (Blue-Green), G (Green), Y (Yellow), W (White), and R (Red).

The tri-state non-inverting buffers 62a, 62b, and 62c can be simultaneously enabled by applying a low logic level signal to the enable input E of an inverter 64b, and disabled by applying a logic high level signal thereto. When all tri-state non-inverting buffers 62a, 62b, and 62c are enabled, the conditions of red bus 5, green bus 6, and blue bus 7 can be selectively controlled by applying valid combinations of logic level signals to color control inputs B, P, BG, G, Y, W, and R, for illuminating display element 43 in a selected color. When all tri-state non-inverting buffers 62a, 62b, and 62c are disabled, all three buses are effectively disconnected, and display element 43 is extinguished. Thus a high logic level at the enable input E extinguishes display element 43. A low logic level at the enable input E illuminates display element 43 in a color determined by the instant conditions of the color control logic inputs B, P, BG, G, Y, W, and R.

When the enable input E is at a low logic level, the output of inverter 64b rises to a high logic level, thereby simultaneously causing the output of tri-state buffer 61a to be effectively connected to red bus 5, the output of tri-state buffer 61b to be effectively connected to green bus 6, and the output of tri-state buffer 61c to be effectively connected to blue bus 7, allowing the currents, which are controlled by the conditions of the color control inputs B, P, BG, G, Y, R, and R, to flow through red bus 5, green bus 6, and blue bus 7, for controlling the color of display element 43.

The color control inputs B, P, BG, G, Y, W, and R are applied to the inputs of three 4-input OR gates 61a, 61b, and 61c, whose outputs respectively drive non-inverting buffers 62a, 62b, 63c. Color control R is applied directly to the input of OR gate 61a; color control input G is applied directly to the input of OR gate 61b; color control input B is applied directly to the input of OR gate 61c.

Color control input Y is applied simultaneously to the inputs of both OR gates 61a, 61b; color control input BG is applied simultaneously to the inputs of OR gates 61b, 61c; color control input P is applied simultaneously to the inputs of both OR gates 61a, 61c. Color control input W is applied simultaneously to the inputs of all three OR gates 61a, 61b, 61c.

The operation of 3-primary color 7-segment display element 43 shown in FIG. 3 will be now explained by the example of illuminating a digit '1' in seven different colors. It is assumed in all these seven examples that the enable input E is at a low logic level, for enabling display element 43. To display decimal number '1', a BCD code 0001 is applied to the inputs A0, A1, A2, A3 of common anode 7-segment decoder 24. The decoder 24 develops low voltage levels at its outputs b, c, to illuminate segments b, c, and high voltage levels at all remaining outputs (not shown), to extinguish all remaining segments.

To illuminate display element 43 in red color, color control input R is raised to a high logic level, while all remaining color control inputs are maintained at a low logic level. As a result, the output of OR gate 61a rises to a high logic level, thereby causing the output of buffer 62a to rise to a high logic level. The current flows from the output of buffer 62a, via red bus 5, red LED 2b, to the output b of decoder 24, and, via red LED 2c, to the output c of decoder 24. As a result, segments b, c illuminate in red color, thereby causing a visual impression of a character '1'. The green LEDs 3b, 3c and blue LEDs 4b, 4c remain extinguished because green bus 6 and blue bus 7 are disabled.

To illuminate display element 43 in green color, color control input G is raised to a high logic level, while all remaining color control inputs are maintained at a low logic level. As a result, the output of OR gate 61b rises to a high logic level, thereby causing the output of buffer 62b to rise to a high logic level. The current flows from the output of buffer 62b, via green bus 6, green LED 3b, to the output b of decoder 24, and, via green LED 3c, to the output c of decoder 24. As a result, segments b, c illuminate in green color.

To illuminate display element 43 in blue color, color control input B is raised to a high logic level, while all remaining color control inputs are maintained at a low logic level. As a result, the output of OR gate 61c rises to a high logic level, thereby causing the output of buffer 62c to rise to a high logic level. The current flows from the output of buffer 62c, via blue bus 7, blue LED 4b, to the output b of decoder 24, and, via blue LED 4c, to the output c of decoder 24. As a result, segments b, c illuminate in blue color.

To illuminate display element 43 in yellow color, color control input Y is raised to a high logic level, while all remaining color control inputs are maintained at a low logic level. As a result, the outputs of OR gates 61a, 61b rise to a high logic level, thereby causing the outputs of buffers 62a, 62b to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of the decoder 24. As a result of blending light of red and green colors, segments b, c illuminate in substantially yellow color.

To illuminate display element 43 in purple color, color control input P is raised to a high logic level, while all remaining color control inputs are maintained at a low logic level. As a result, the outputs of OR gates 61a, 61c rise to a high logic level, thereby causing the outputs of buffers 62a, 62c to rise to a high logic level. The current flows from the output of buffer 62a, via red bus 5, red LED 2b, to the output b of decoder 24, and, via red LED 2c, to the output c of decoder 24. The current also flows from the output of buffer 62c, via blue bus 7, blue LED 4b, to the output b of decoder 24, and, via blue LED 4c, to the output c of decoder 24. As a result of blending light of red and blue color, segments b, c illuminate in substantially purple color.

To illuminate display element 43 in blue-green color, color control input BG is raised to a high logic level, while all remaining color control inputs are maintained at a low logic level. As a result, the outputs of OR gates 61b, 61c rise to a high logic level, thereby causing the outputs of buffers 62b, 62c to rise to a high logic level. The current flows from the output of buffer 61b, via green bus 6, green LED 3b, to the output b of decoder 24, and, via green LED 3c, to the output c of decoder 24. The current also flows from the output of decoder 62c, via blue bus 7, blue LED 4b, to the output b of decoder 24, and, via blue LED 4c, to the output c of decoder 24. As a result of blending light of green and blue colors, segments b, c illuminate in substantially blue-green color.

To illuminate display element 43 in white color, color control input W is raised to a high logic level, while all remaining color control inputs are maintained at a low logic level. As a result, the outputs of OR gates 61a, 61b, 61c rise to a high logic level, thereby causing the outputs of respective buffers 62a, 62b, and 62c to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of decoder 24. The current also flows from the output of buffer 62c, via blue bus 7, blue LED 4b, to the output b of decoder 24, and, via blue LED 4c, to the output c of decoder 24. As a result of blending light of red, green, and blue colors, segments b, c illuminate in substantially white color.

When the enable input E is raised to a high logic level, the output of inverter 64b drops to a low logic level, thereby causing the output of tri-state buffer 62a to be effectively disconnected from red bus 5, the output of tri-state buffer 62b to be effectively disconnected from green bus 6, and the output of tri-state buffer 62c to be effectively disconnected from blue bus 7, not allowing any currents to flow therethrough. As a result, display element 43 completely extinguishes, regardless of the conditions of the color control inputs B, P, BG, G, Y, W, and R. Since the outputs of 7-segment decoder 24 may be overloaded by driving a triad of LEDs in parallel in display element 43, rather than a single LED in a monochromatic display, it would be obvious to employ suitable buffers to drive respective color display segments (not shown).

In FIG. 4, red light emitting diode 2e, green light emitting diode 3e, and blue light emitting diode 4e are placed on the base of a segment body 15b, which is filled with transparent light scattering material 16. Red LEDs are typically manufactured by diffusing a p-n junction into a GaAsP epitaxial layer on a GaAs substrate; green LEDs typically use a GaP epitaxial layer on a GaP substrate; blue LEDs are typically made from SiC material.

When forwardly biased, light emitting diodes 2e, 3e, and 4e emit light signals of red, green, and blue colors, respectively, which are scattered within transparent material 16, thereby blending the red, green, and blue light signals into a composite light signal that emerges at the upper surface of segment body 15b. The color of the composite light signal may be controlled by varying the portions of the red, green, and blue light signals.

Figure 5:
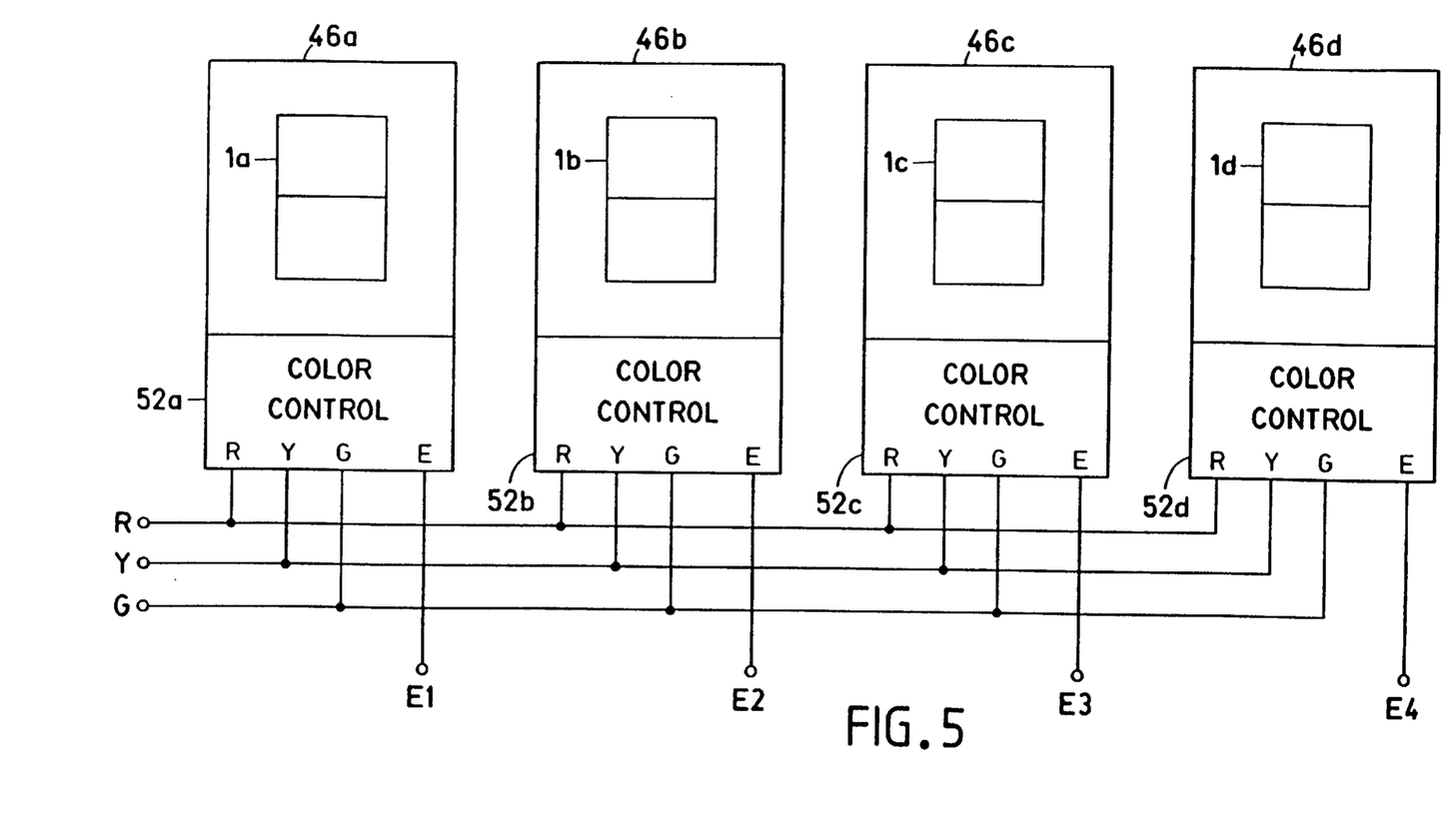
FIG. 5 is a block diagram of a 2-primary color multicolor 4-digit display.

To illustrate how the present invention can be utilized in multi-element multicolor display configuration, in FIG. 5 is shown a detail of the interconnection in a 2-primary color 4-digit display. The color control inputs R, Y, and G of all display characters 46a, 46b, 46c, and 46d are interconnected, respectively, and the enable inputs E1, E2, E3, and E4 are used to control the conditions of respective display elements. A high logic level at the enable input E extinguishes the particular display element. A low logic level at the enable input E illuminates the display element in a color determined by the instant conditions of the color control inputs R, Y, and G.

Figure 6:
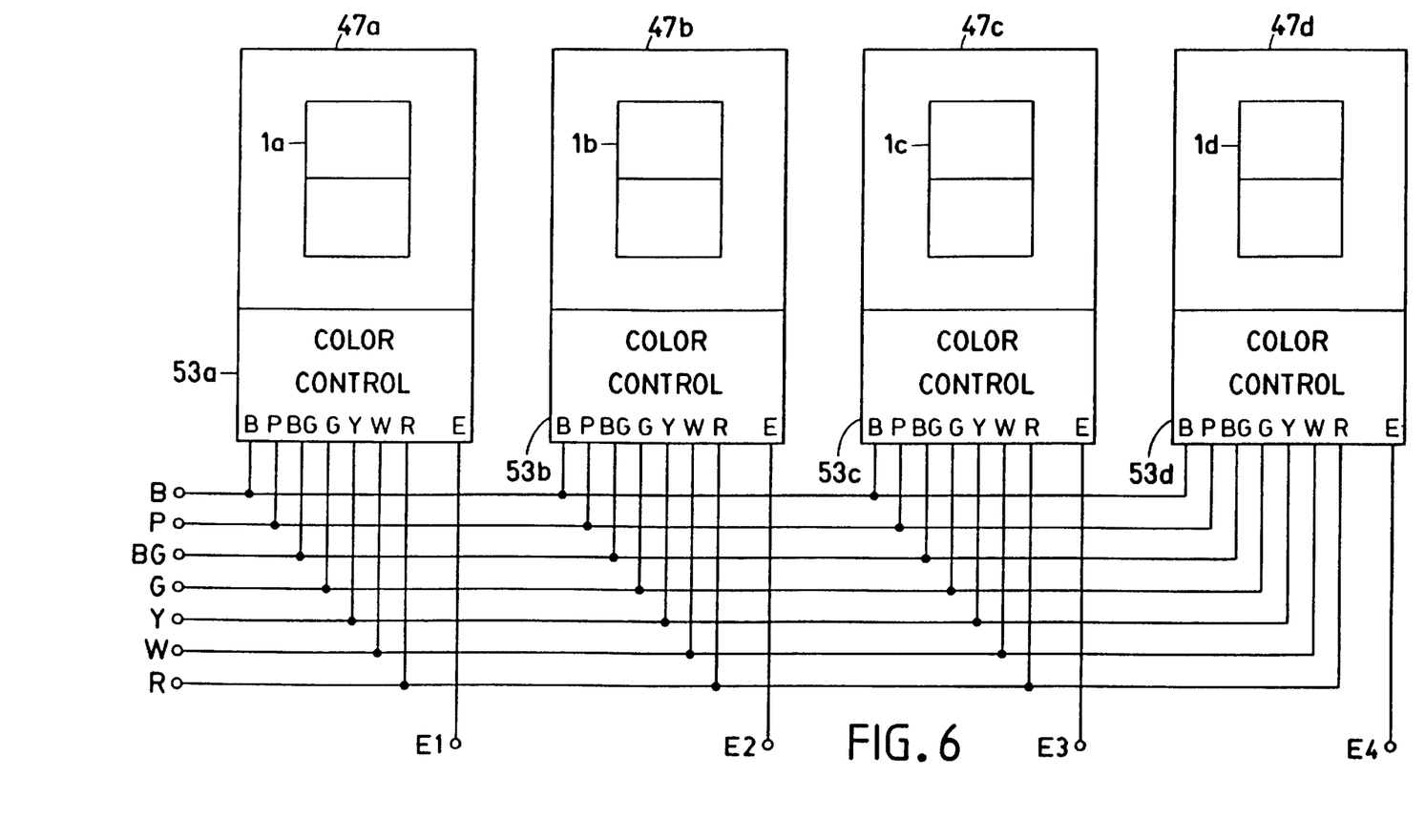
FIG. 6 is a block diagram of a 3-primary color multicolor 4-digit display.

In FIG. 6 is shown a like detail of the interconnection in a 3-primary color 4-digit display. Similarly, the color control inputs B, P, BG, G, Y, W, and R of all display characters 47a, 47b, 47c, and 47d are interconnected. The conditions of respective display elements are controlled by the enable inputs E1, E2, E3, and E4. A high logic level at the enable input E extinguishes the particular display element. A low logic level therein illuminates the display element in a color determined by the instant conditions of the color control logic inputs B, P, BG, G, Y, W, and R.

Figure 7:
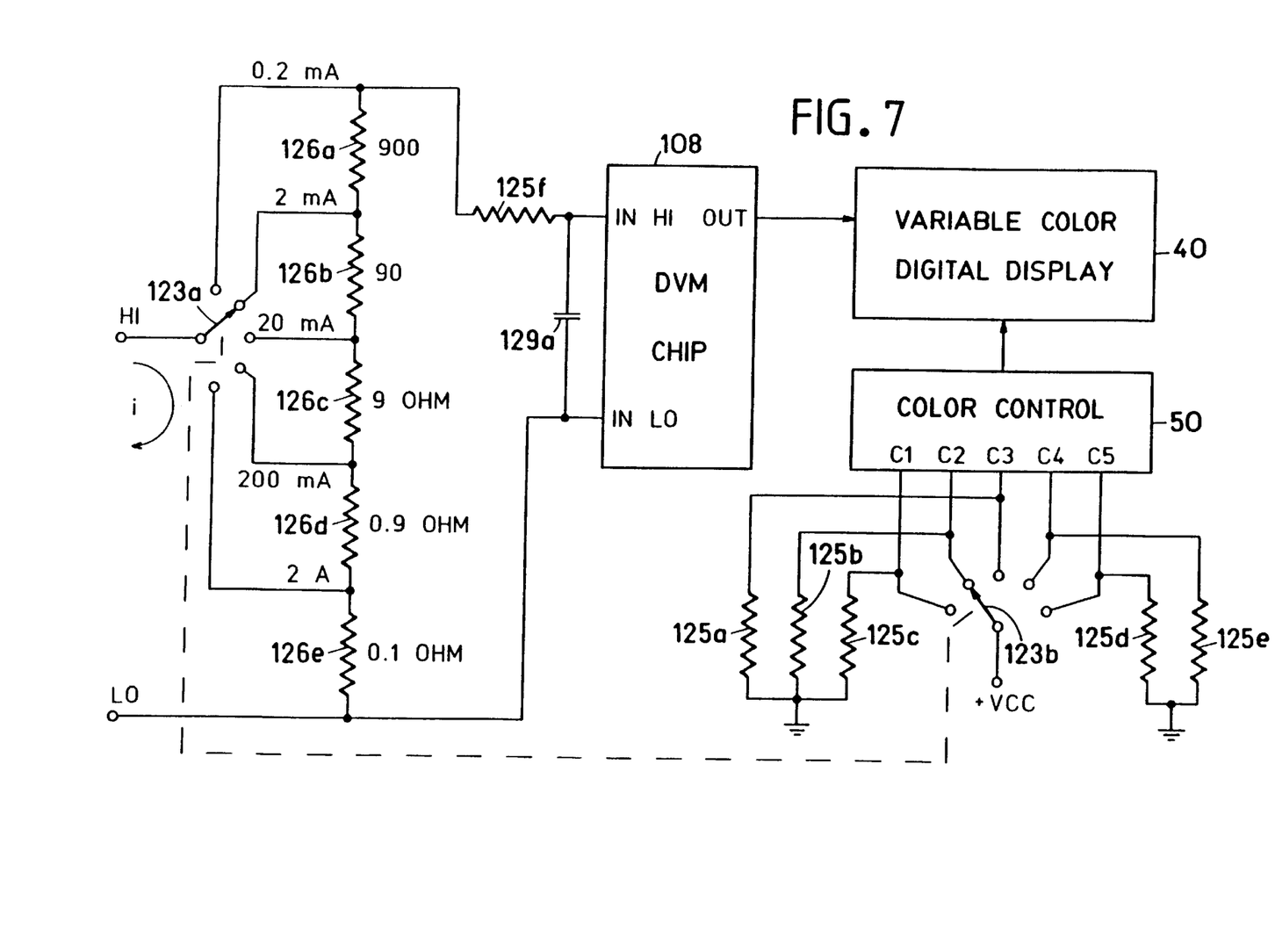
FIG. 7 is a simplified schematic diagram of a digital ampermeter with variable color range indication.

In FIG. 7 is shown a simplified schematic diagram of a digital ampermeter with variable color range indication. The precision shunt resistors 126a, 126b, 126c, 126d, and 126e, connected in series, convert measured current to voltage, which is applied, via a resistor 125f of suitable value, to the input terminal of a digital voltmeter 108. The current range is selectable by a rotary switch 123a, in a manner well known to those skilled in the art. The invention resides in the addition of a second rotary switch 123b, associated with rotary switch 123a such that both switches are always in the same position, to connect the reference voltage +VCC to the selected one of the cclor control inputs, in accordance with the selected current range. The remaining color control inputs are tied to ground via suitable pull down resistors 125a, 125b, 125c, 125d, and 125e. By way of an example, digital display 40 may indicate measured current values on the 0.2 mA range in blue color, on the 2 mA range in purple color, on the 20 mA range in green color, on the 200 mA range in yellow color, and on the 2 A range in red color.

Figure 8:
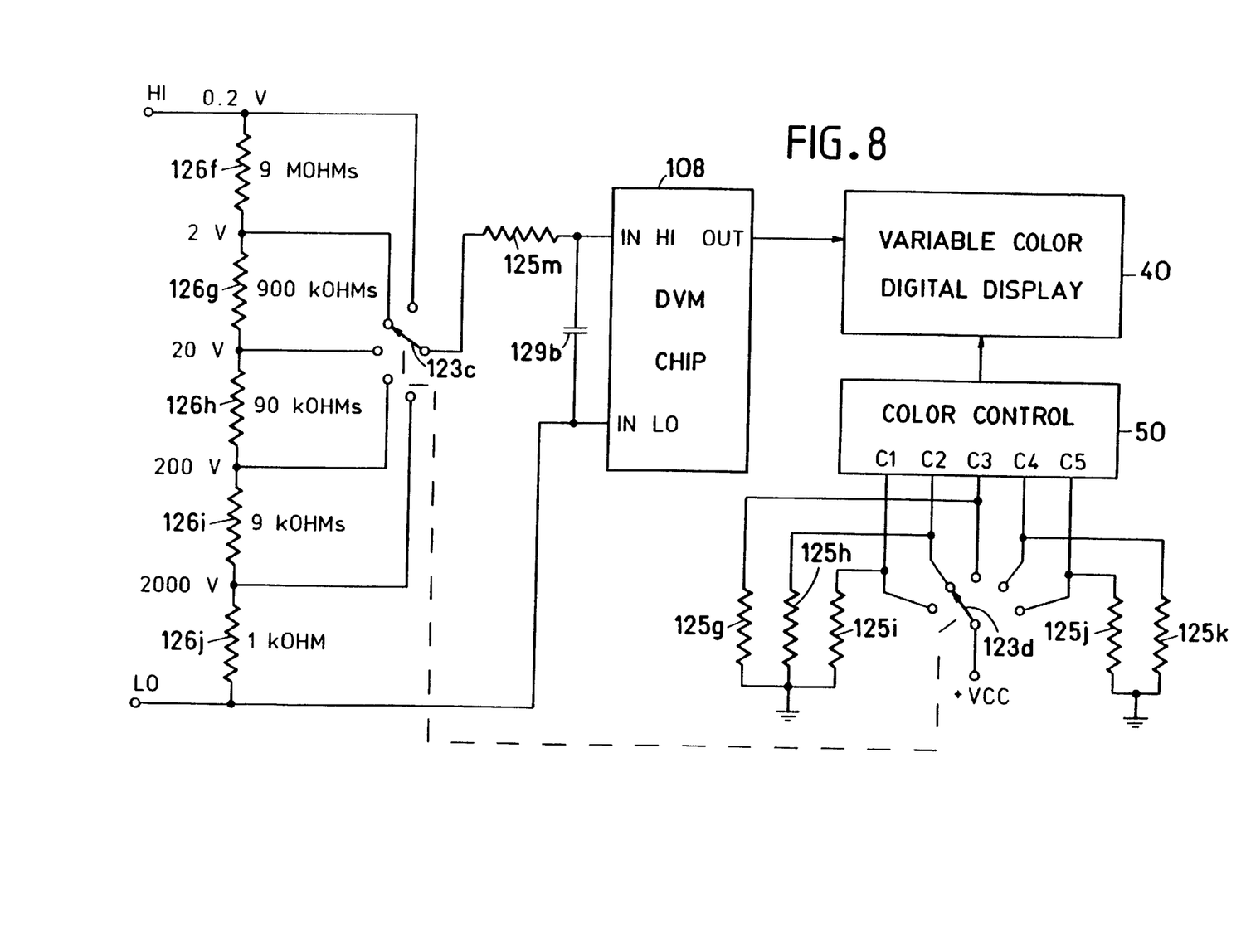
FIG. 8 is a simplified schematic diagram of a digital voltmeter with variable color range indication.

In FIG. 8 is shown a simplified schematic diagram of a digital voltmeter with variable color range indication. The precision voltage attenuating resistors 126f, 126g, 126h, 126i, and 126j are connected in series, and the voltage range is selected by a rotary switch 123c, in a manner well understood by those skilled in the art. The invention resides in the addition of a second rotary switch 123d, associated with the switch 123c, to apply the reference voltage +VCC to the selected color control input. By way of an example, digital display 40 may indicate measured values on the 0.2 V range in white color, on the 2 V range in yellow color, on the 20 V range in green color, on the 200 V range in blue-green color, and on the 2000 V range in red color.

Figure 9:
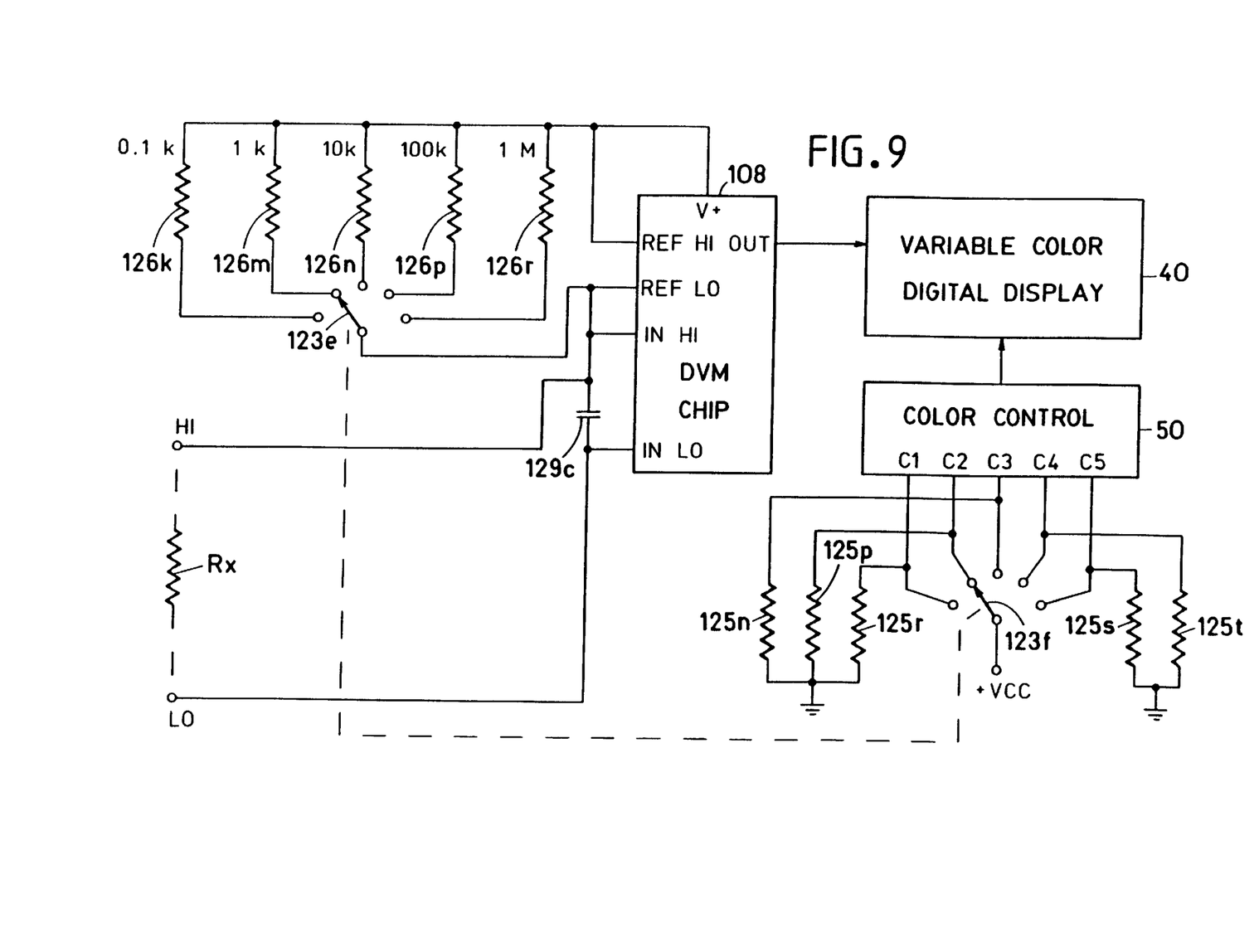
FIG. 9 is a simplified schematic diagram of a digital ohmmeter with variable color range indication.

In FIG. 9 is shown a simplified schematic diagram of a digital ohmmeter with variable color range indication. The precision standard resistors 126k, 126m, 126n, 126p, and 126r, selectable by a rotary range switch 123e, are connected such that the selected one of the standard resistors is in series with the measured resistance Rx, in a well known ratiometric arrangement. The invention resides in the addition of a second switch 123f, associated with the switch 123e, to connect the reference voltage +VCC to the selected one of the color control inputs, in accordance with the selected resistance range. By way of an example, digital display 40 may indicate measured resistance values on the 0.1 k range in yellow color, on the 1 k range in green color, on the 10 k range in blue color, on the 100 k range in purple color, and on the 1 M range in red color.

The examples of range and precision resistor values shown in FIGS. 7, 8, and 9 should be considered merely as exemplary. Although the switches 123 are shown as rotary switches, they may, alternatively, be of any other type, such as pushbutton switches, relay contacts, or solid state switches. Another modification envisions that only certain of the display digits may change color in accordance with the measurement range, while the remaining display digits ay change color in accordance with a different quantity. It is readily apparent that the principles of the invention may be effectively applied to autoranging multimeters.

Figure 10:
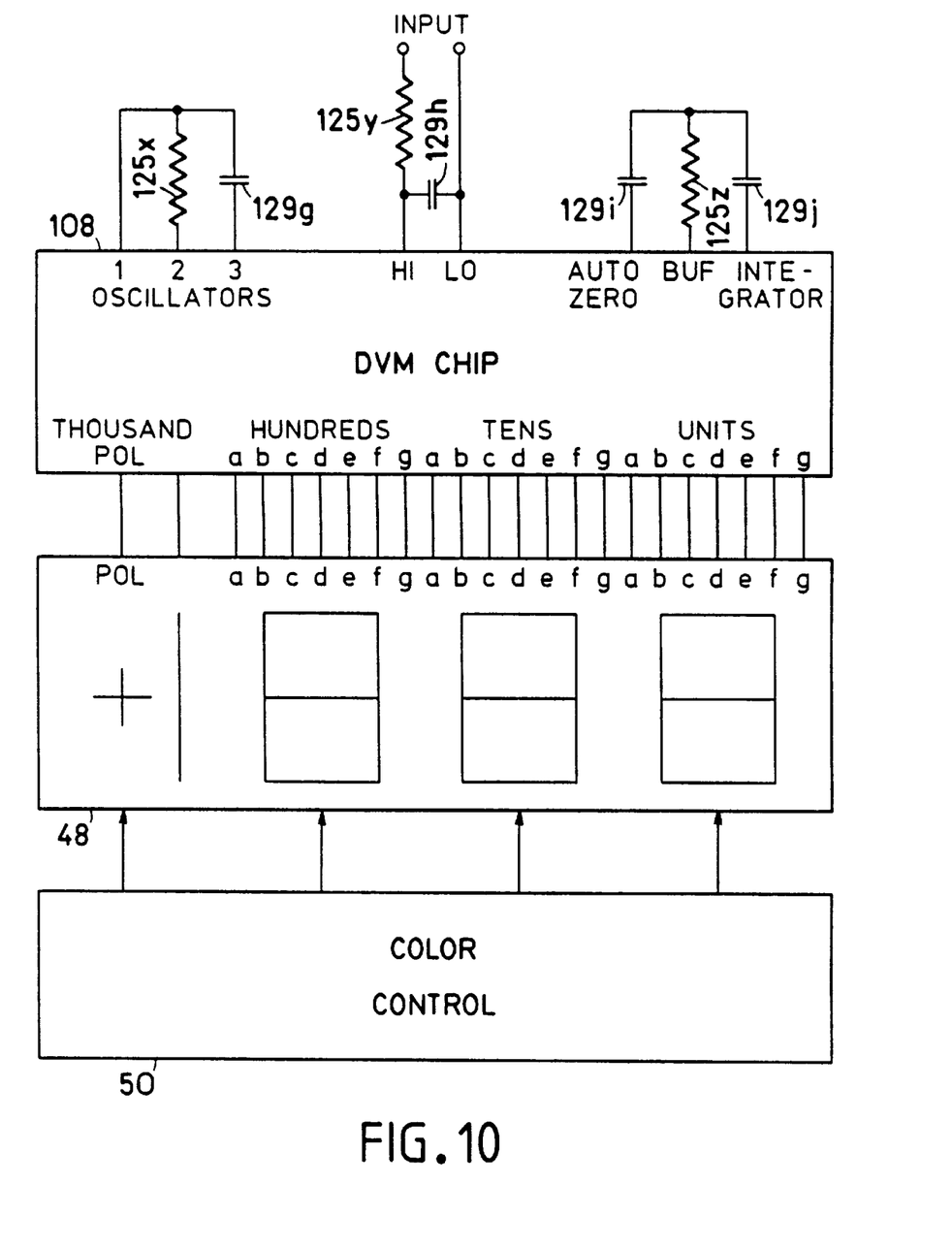
FIG. 10 is a detail of the multimeter shown in FIGS. 7, 8, and 9.

In FIG. 10 is shown a detail of the multimeter of FIGS. 7, 8, or 9 which includes a DVM chip 108 capable of converting analog voltage applied to its inputs HI and LO into signals for directly driving respective segments of a 3½ digit 7-segment variable color display 48. The color control 50 causes display 48 to illuminate in a selected color, as described previously.

In brief summary, the invention describes a measuring device which comprises a device for measuring a signal and for developing output data indicative of the measured value of the signal and an input scaling device having a plurality of measurement ranges for selectively scaling the measured signals. A variable color digital display device responsive to the output data indicates the measured value of the signal. A range selector sets the input scaling device to a suitable measurement range. A color selector, associated with the range selector, develops a selector signal indicative of the selected measurement range. A color control, responsive to the selector signal, illuminates the digital indication of the measured value in a color in accordance with the selected measurement range.

It would be obvious, in the view of the present disclosure, that the hardware design of the present invention may be also implemented by software. It would be further obvious that persons skilled in the art may resort to modifications in the construction of the preferred embodiment described herein, without departing from the spirit and scope of the invention as defined in the appended claims. It is contemplated that the principles of the invention are also applicable to numerous diverse types of display devices, such as luminescent devices, liquid crystal display devices, plasma display devices, cathode ray tube display devices, and the like.

CORRELATION TABLE
This is a correlation table of reference characters used in the drawings herein, their descriptions, and examples of commercially available parts

| #DESCRIPTION | EXAMPLE |
|---|---|
| 2 red LED | |
| 3 green LED | |
| 4 blue LED | |
| 5 red bus | |
| 6 green bus | |
| 7 blue bus | |
| 15 segment body | |
| 16 light scattering material | |
| 23 common cathode 7-segment decoder | 74LS49 |
| 24 common anode 7-segment decoder | 74LS47 |
| 40 variable color digital display | |
| 42 multicolor 7-segment display element (2 LEDs) | |
| 43 multicolor 7-segment display element (3 LEDs) | |
| 46 one multicolor display character (2 LEDs) | |
| 47 one multicolor display character (3 LEDs) | |
| 48 3 1/2 digit variable color display | |
| 50 color control | |
| 52 color control (2 LEDs) | |

-continued

CORRELATION TABLE
This is a correlation table of reference characters
used in the drawings herein, their descriptions, and
examples of commercially available parts

| #  | DESCRIPTION          | EXAMPLE           |
|----|----------------------|-------------------|
| 53 | color control (3 LEDs) |                 |
| 60 | 2-input OR gate      | 74HC32            |
| 61 | 4-input OR gate      | 4072              |
| 62 | non-inverting buffer | 74LS244           |
| 63 | inverting buffer     | 74LS240           |
| 64 | inverter             | part of 74LS240,4 |
| 108| DVM chip             | Teledyne TSC7107  |
| 123| rotary switch        |                   |
| 125| resistor             |                   |
| 126| precision resistor   |                   |
| 129| capacitor            |                   |

The parts shown in the Correlation Table are merely exemplary. It would be obvious to those skilled in the art that other components may be readily and effectively used.

What is claimed is:

1. A measuring device comprising:

means for measuring a signal and for developing data indicative of the measured value of the signal;

measurement range means coupled to said means for measuring and including a plurality of measurement ranges;

means for switching said measurement range means to a selected measurement range;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, said diodes being operable to provide a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and color control means, associated with said means for switching, for applying a color control signal to one of said color control inputs, in accordance with the selected measurement range, for forwardly biasing said light emitting diodes in certain ones of said display areas, in accordance with said decoder output signals, for illuminating said character indication in a composite color unique to the selected measurement range.

2. A measuring device comprising:

means for measuring a signal and for developing data indicative of the measured value of the signal;

measurement range means coupled to said means for measuring and including a plurality of measurement ranges;

a first switch having a plurality of positions, for switching to one of its positions to select one of said measurement ranges;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, said diodes being operable to provide a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and a second switch having a plurality of positions, equal in number to said plurality of positions of said first switch and respectively associated therewith such that said second switch is always in the same position as said first switch, for switching to one of its positions corresponding to the position of said first switch, for applying a color control signal to one of said color control inputs, in accordance with the selected measurement range, for forwardly biasing said light emitting diodes in certain ones of said display areas, in accordance with said decoder output signals, for illuminating said character indication in a composite color unique to the selected measurement range.

3. A measuring device comprising:

an ampermeter for measuring a current and for developing output data indicative of the measured value of the current;

measurement range means coupled to said ampermeter and including a plurality of current ranges;

means for switching said measurement range means to a selected current range;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and color control means, associated with said means for switching, for applying a color control signal to one of said color control inputs, in accordance with the selected current range, for forwardly biasing said light emitting diodes in certain ones of said display areas, in accordance with said decoder output signals, for illuminating said character indication in a composite color unique to the selected current range.

4. A measuring device comprising:

a voltmeter for measuring a voltage and for developing output data indicative of the measured value of the voltage;

measurement range means coupled to said voltmeter and including a plurality of voltage ranges;

means for switching said measurement range means to a selected voltage range;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and color control means, associated with said means for switching, for applying a color control signal to one of said color control inputs, in accordance with the selected voltage range, for forwardly biasing said light emitting diodes in certain ones of said display areas, in accordance with said decoder output signals, for illuminating said character indication in a composite color unique to the selected voltage range.

5. A measuring device comprising:

an ohmmeter for measuring a resistance and for developing output data indicative of the measured value of the resistance;

measurement range means coupled to said ohmmeter and including a plurality of resistance ranges;

means for switching said measurement range means to a selected resistance range;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and color control means, associated with said means for switching, for applying a color control signal to one of said color control inputs, in accordance with the selected resistance range, for forwardly biasing said light emitting diodes in certain ones of said display areas, in accordance with said decoder output signals, for illuminating said character indication in a composite color unique to the selected resistance range.

6. A measuring device comprising:

an ampermeter for measuring a current and for developing output data indicative of the measured value of the current;

measurement range means coupled to said ampermeter and including a plurality of current ranges;

a first switch having a plurality of positions, for switching to one of its positions to select one of said current ranges;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and a second switch having a plurality of positions, equal in number to said plurality of positions of said first switch and respectively associated therewith such that said second switch is always in the same position as said first switch, for switching to one of its positions corresponding to the position of said first switch, for applying a color control signal to one of said color control inputs, in accordance with the selected current range, for forwardly biasing said light emitting diodes in certain ones of said display areas, in accordance with said decoder output signals, for illuminating said character indication in a composite color unique to the selected current range.

7. A measuring device comprising:

a voltmeter for measuring a voltage and for developing output data indicative of the measured value of the voltage;

measurement range means coupled to said voltmeter and including a plurality of voltage ranges;

a first switch having a plurality of positions, for switching to one of its positions to select one of said voltage ranges;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and a second switch having a plurality of positions, equal in number to said plurality of positions of said first switch and respectively associated therewith such that said second switch is always in the same position as said first switch, for switching to one of its positions corresponding to the position of said first switch, for applying a color control signal to one of said color control inputs, in accordance with the selected voltage range, for forwardly biasing said light emitting diodes in certain ones of said display areas, in accordance with said decoder output signals, for illuminating said character indication in a composite color unique to the selected voltage range.

8. A measuring device comprising:

an ohmmeter for measuring a resistance and for developing output data indicative of the measured value of the resistance;

measurement range means coupled to said ohmmeter and including a plurality of resistance ranges;

a first switch having a plurality of positions, for switching to one of its positions to select one of said resistance ranges;

a display device including a plurality of display areas arranged in a pattern for exhibiting, upon selective activation, a plurality of characters, each said display area including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said display area to obtain a light signal of a composite color;

a plurality of color control inputs coupled for forwardly biasing a selective combination of said first light emitting diodes, said second light emitting diodes, and said third light emitting diodes, in accordance with a color control signal applied to one of said color control inputs;

means for decoding including a decoder input, for receiving said data, and a plurality of decoder outputs, coupled to said light emitting diodes in accordance with their positions in said pattern, for producing decoder output signals for providing a character indication of said data; and a second switch having a plurality of positions, equal in number to said plurality of positions of said first switch and respectively associated therewith such that said second switch is always in the same position as said first switch, for switching to one of its positions corresponding to the position of said first switch, for applying a color control signal to one of said color control inputs, in accordance with the selected resistance range, for forwardly biasing said light emitting diodes in certain ones of said display areas, in accordance with said decoder output signals, for illuminating said character indication in a composite color unique to the selected resistance range.

\* \* \* \* \*